United States Patent
Paintz et al.

(10) Patent No.: US 9,537,399 B2
(45) Date of Patent: Jan. 3, 2017

(54) DIRECT CURRENT CONTROL WITH LOW E-M EMISSION

(71) Applicant: MELEXIS TECHNOLOGIES NV, Tessenderlo (BE)

(72) Inventors: Christian Paintz, Erfurt (DE); Thomas Freitag, Plaue (DE); Heiko Grimm, Waltershausen (DE); Enrico Reinhardt, Bad Langensalza (DE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 72 days.

(21) Appl. No.: 14/353,201

(22) PCT Filed: Oct. 19, 2012

(86) PCT No.: PCT/EP2012/070831
§ 371 (c)(1),
(2) Date: Apr. 21, 2014

(87) PCT Pub. No.: WO2013/057301
PCT Pub. Date: Apr. 25, 2013

(65) Prior Publication Data
US 2014/0320103 A1    Oct. 30, 2014

(30) Foreign Application Priority Data
Oct. 19, 2011    (GB) .................................. 1117977.7

(51) Int. Cl.
H02M 3/158    (2006.01)
H03K 17/16    (2006.01)
H02M 1/44    (2007.01)

(52) U.S. Cl.
CPC ............. *H02M 3/1588* (2013.01); *H02M 1/44* (2013.01); *H03K 17/166* (2013.01); *Y02B 70/1466* (2013.01)

(58) Field of Classification Search
CPC ...... H02M 3/1588; H02M 1/44; H03K 17/166
See application file for complete search history.

(56) References Cited

U.S. PATENT DOCUMENTS 5,801,458 A     9/1998    Marks
6,396,252 B1 *  5/2002    Culpepper ............ H02M 3/156
                                                323/284

(Continued)

FOREIGN PATENT DOCUMENTS

DE             4013997 A1    11/1991
DE        102008026500 A1     7/2009

(Continued)

OTHER PUBLICATIONS

Great Britain Search Report for corresponding Great Britain Application No. 117977.7, mailed on Feb. 15, 2012.

(Continued)

*Primary Examiner* — Jue Zhang
(74) *Attorney, Agent, or Firm* — Workman Nydegger (57) ABSTRACT

A switching control circuit includes driving a flow of direct current through an at least partially inductive load. The switching control circuit is adapted for adjusting a control current in order to activate and/or deactivate a flow of current to a load terminal. The system comprises a timer element for initiating at least one timed adjustment of the control current during activation or deactivation of the flow of current through a first semiconductor switch of the circuit so as to anticipate a state change of a component of the switching control circuit. The controller is adapted for determining a timing for the timed adjustment in a predictive manner. A method employs the various features of the switching control circuit.

20 Claims, 7 Drawing Sheets

(56) References Cited

U.S. PATENT DOCUMENTS

| | | | |
|---|---|---|---|
| 7,205,821 B2 | 4/2007 | Rutter | |
| 7,705,579 B1* | 4/2010 | Hariman | H02M 3/156 |
| | | | 323/284 |
| 7,714,558 B2* | 5/2010 | Wu | H02M 1/32 |
| | | | 323/284 |
| 7,746,926 B2* | 6/2010 | Chu | H02M 3/156 |
| | | | 332/109 |
| 7,936,160 B1* | 5/2011 | Sheehan | H02M 3/156 |
| | | | 323/285 |
| 8,154,264 B2* | 4/2012 | Kenly | H02M 3/156 |
| | | | 323/285 |
| 8,253,407 B2* | 8/2012 | Chen | H02M 3/1588 |
| | | | 323/284 |
| 8,274,268 B2* | 9/2012 | Yen | H02M 3/156 |
| | | | 323/282 |
| 2001/0040470 A1 | 11/2001 | Brando et al. | |
| 2006/0038545 A1 | 2/2006 | Rutter | |
| 2010/0156366 A1* | 6/2010 | Sakai et al. | 323/282 |

FOREIGN PATENT DOCUMENTS

| | | |
|---|---|---|
| GB | 2417149 A | 2/2006 |
| GB | 2417625 A | 3/2006 |
| GB | 2433358 A | 6/2007 |
| WO | 2004051851 A1 | 6/2004 |

OTHER PUBLICATIONS

International Search Report for corresponding International PCT Application No. PCT/EP2012/070831, mailed Jan. 31, 2013.

* cited by examiner

DIRECT CURRENT CONTROL WITH LOW E-M EMISSION

FIELD OF THE INVENTION

The invention relates to the field of direct current supply control for inductive loads. More specifically it relates to a control circuit for turning on and off a direct current supply for an inductive load power circuit.

BACKGROUND OF THE INVENTION

Typically, a switching control circuit may be connected between a direct current power supply and a power load in series to obtain controlled activation and deactivation of the power load by an external trigger signal. When the impedance of the power load has a substantial inductive component, a free wheeling element, e.g. a flyback diode, may be placed in parallel to the power load to provide a path to conduct transient currents which are induced when altering the supplied voltage to the inductive load.

A switching control circuit commonly comprises a semiconductor switch, for example a metal-oxide semiconductor field-effect transistor (MOSFET). In such MOSFET's, a voltage on the gate contact determines conduction of a channel between the other two contacts, called source and drain. If a sufficient voltage over the gate is maintained, a supply voltage will be supplied to a load terminal, and hence also to the flyback diode. If the gate voltage is reduced in order to deactivate the load, the internal resistance of the transistor, i.e. over the source-drain channel, will rise. However, the inductive component of the load will resist a change in its power supply and will maintain the current flowing through the transistor at a high level. The increased resistance of the transistor will therefore generate a substantial amount of heat, and may result in damage to the circuit if the gate voltage is reduced too fast with respect to the time needed for the flyback diode to divert the current flow.

In the German patent publication DE 4013997 A1, a switching control circuit for controlling a DC current through an inductive load is disclosed which comprises a measuring means and evaluating means for maintaining the gate voltage sufficiently high while deactivating the load until activation of the flyback diode is detected. Particularly, the measuring means measures a voltage at the semiconductor terminal connected to the load and to the flyback diode. When the semiconductor switch is turned off, the evaluating means maintains the MOSFET gate current at a high value until the load terminal voltage reaches an upper threshold value indicating that the flyback diode is contributing to the current flow, after which the gate current is further lowered. Similarly, at the activation of the semiconductor switch, the gate current is kept at a low value until the measured voltage exceeds a lower threshold value, indicating that the flyback diode stopped conduction, after which the gate current is increased.

This arrangement may reduce the undesirable effects of power dissipation in the semiconductor, but because the gate current is not reduced before the flyback diode starts to conduct, deep voltage transients at the deactivation of the switch might occur, which can lead to increased electromagnetic emissions. Such emission may be avoided by reducing the initial discharge current to a lower level, which in turn leads to longer turn-off times and consequently increased overall power dissipation in the semiconductor switch.

Furthermore, because the power dissipation of the semiconductor switch is proportional to the drain current times the drain-source voltage, it is the highest during the reverse recovery time, which, for high performance semiconductor switches with integrated anti parallel diodes, e.g. IPD50N04S4-10, may be in the range of 30 ns. The typical delay of fast comparators (e.g. LM119) with high input voltage capability required for the full voltage swing at the load terminal is typically in the range of 80 ns. Therefore the comparator delay is significantly increasing the power dissipation within the semiconductor switch because the increase of the charging current is delayed.

In the United States patent publication U.S. Pat. No. 5,801,458, another method for controlling a DC current through an inductive load is disclosed, in which the current for turning off the semiconductor switch is also reduced from a higher initial value to a value so that the semiconductor switch is only completely turned off when the free wheeling element has started conduction. In this publication, a turn-off discharge current source is used, which is continuously reducing the discharge current in dependency of the voltage on the free wheeling element so that minimum current is reached when the voltage on the free wheeling element is reaching 0V.

Although this method can reduce the discharge current to a low value when the free wheeling element starts to conduct, the method can only start to reduce the discharge current after the voltage on the flyback diode has started to drop, which may be too late to react for the current source to reduce its current, especially taking an additional delay of the measurement circuit into consideration. This may lead to a rapid voltage change on the free wheeling element and may cause increased electromagnetic emissions. In order to avoid such emissions, the initial discharge current must be reduced to a lower level, which in turn leads to longer turn-off times and consequently increased overall power dissipation in the semiconductor switch.

SUMMARY OF THE INVENTION

It is an object of embodiments of the present invention to provide efficient current modulation with low or limited electromagnetic emissions while controlling a DC current through an inductive load.

It is an advantage of embodiments according to the present invention that limited switching losses may be obtained while controlling a DC current through an inductive load.

It is an advantage of embodiments according to the present invention that high switching speeds may be obtained.

It is an advantage of embodiments according to the present invention that a switching control circuit may be obtained that is robust to short-circuiting while activation and deactivation control signals are presented in quick succession.

It is an advantage of embodiments according to the present invention that, by using a predictive time schedule for control signals for the switching control circuit, a smooth current commutation can be provided.

The above objective is accomplished by a method and device according to the present invention.

The present invention relates to a method for controlling a flow of direct current through an at least partially inductive load by way of driving at least a first semiconductor switch and at least one semiconductor freewheeling component, the method comprising driving a control gate of the at least a first semiconductor switch with a control current ($I_G$) for controlling a resistance of a path between a load terminal connected to said at least partially inductive load and a supply terminal connected to a supply voltage source, determining a predetermined time for adjusting the control current in a predictive manner, based on a measurement in one cycle for switching the first semiconductor switch, so as to anticipate a state change of the first semiconductor switch and/or the at least one semiconductor freewheeling component, and, in a later cycle for switching the first semiconductor switch, adjusting the control current ($I_G$) in order to alter the flow of current to said load terminal after a predetermined time.

The method may comprise determining a predetermined time for adjusting the control current based on a measurement in an earlier cycle for switching the first semiconductor switch. The earlier cycle may be the previous cycle, one or more recent cycles, etc.

Determining the predetermined time may comprise determining a current direction indication and adjusting the control current may be based on the current direction indication. The current direction indication may be determined in a cycle and the determined current direction indication may be used in a later cycle in order to adjust the control current.

The method for determining a predetermined time may comprise evaluating a state change of the first semiconductor switch or the semiconductor freewheeling component storing the predetermined time for use in a future switching action. The future switching action may be the next cycle for switching the first semiconductor switch.

Determining a predetermined time may comprise comparing a voltage at the load terminal to a reference voltage.

The comparing may comprise determining a sign of a difference between the voltage at the load terminal and the reference voltage.

Determining a predetermined time may comprise determining a difference between an edge signal in a compared voltage at the load terminal and the reference voltage on the one hand and a state transition of the first semiconductor switch and/or the semiconductor freewheeling component.

The method may comprise adjusting the predetermined time if the determined difference is not within a predetermined range of values.

The predetermined time may be determined, taking into account delays occurring in the prediction process.

Controlling a flow of direct current through an at least partially inductive load may be performed by way of driving at least a first semiconductor switch, a second semiconductor switch, a first semiconductor freewheeling component and a second semiconductor freewheeling component, wherein after receiving a falling PWM input and for a positive current direction through the load, the method comprises discharging a control gate of the first semiconductor switch with a first discharge current strength and reducing the first discharge current strength to a second discharge current strength after a first predetermined time, discharging the control gate of the first semiconductor switch with the second discharge current strength and reducing after a second predetermined time the second discharge current strength to a third discharge current smaller than a second discharge current strength, discharging the control gate of the first semiconductor switch with a fourth discharge current strength and increasing after a third predetermined time the discharge current strength to a fifth discharge current for rapidly removing the remaining control gate charge, and charging a control gate of the second semiconductor switch with a first charge current strength and increasing a charge current strength to a second charge current strength after a fourth predetermined time, wherein one or more of the first predetermined time, the second predetermined time, the third predetermined time or the fourth predetermined time are determined in a predictive manner.

The first predetermined time may be predicted so that the reducing is performed before a terminal load voltage falls below a first reference voltage.

A new first predetermined time may be predicted for use in a next cycle taking into account a measure of the time difference between the moment reducing is performed in the current cycle and a moment when the terminal load voltage falls below the first reference voltage in the current cycle.

The second predetermined time may be predicted so that the reducing is performed before a terminal load voltage falls below a second reference voltage.

A new second predetermined time may be predicted for use in a next cycle taking into account a measure of the time difference between the moment reducing is performed in the current cycle and a moment when the terminal load voltage falls below the second reference voltage in the current cycle.

The third predetermined time may be predicted so that the increasing the discharge current is performed after the semiconductor freewheeling component is fully turned on.

The fourth predetermined time may be predicted so that increasing a charge current strength to a second charge current strength is performed after the current commutation from the second semiconductor freewheeling component to the second semiconductor switch has finished.

Controlling a flow of direct current through an at least partially inductive load may be performed by way of driving at least a first semiconductor switch, a second semiconductor switch, a first semiconductor freewheeling component and a second semiconductor freewheeling component, wherein after receiving a rising PWM input and for a positive current direction through the load, the method comprises discharging a control gate of the second semiconductor switch with a sixth discharge current strength and reducing the sixth discharge current strength to a seventh discharge current strength after a fifth predetermined time, discharging the control gate of the second semiconductor switch with the seventh discharge current strength and increasing, after the sixth predetermined time, the discharge current strength to an eighth discharge current larger than the seventh discharge current strength, charging a control gate of the first semiconductor switch with a third charge current strength and reducing the charge current strength to a fourth charge current strength after a seventh predetermined time, charging the control gate of the first semiconductor switch with a fourth charge current strength and increasing the charge current strength to a fifth charge current strength after an eighth predetermined time, and charging the control gate of the first semiconductor switch with a sixth charge current strength after a ninth predetermined time, one or more of the fifth predetermined time, the sixth predetermined time, the seventh predetermined time, the eighth predetermined time or the ninth predetermined time are determined in a predictive manner.

The fifth predetermined time may be predicted so that the reducing is performed before the current is commuted from the first semiconductor switch to the first semiconductor freewheeling element.

The sixth predetermined time may be predicted so that increasing the discharge to the eighth discharge current strength is performed before the current commutation from the second semiconductor transistor to the second semiconductor freewheeling component is completed.

It is an advantage of embodiments of the present invention that a phase voltage can be analysed for determining a current direction indicator. The method may include storing the determination results of a cycle. This can e.g. be done in a storage means. Such a current direction indicator then can be used in a next cycle for selecting an appropriate driving waveform shape. In other words, the driving waveform shape thus may depend on the current direction indicator determined in the previous cycle or one of the previous cycles.

In one embodiment, the time is measured when the freewheeling component, e.g. diode, comes out of recovery time and based thereon at least one timing parameter and advantageously two timing parameters are adapted, allowing to guarantee that the current can be decreased when the recovery time starts and increased right after the current commutation process in finished.

The present invention also relates to a switching control circuit or a controller thereof adapted, e.g. programmed, for performing a method as described above.

The present invention furthermore relates to a computer program product for performing, when executed on a computing means, any of the methods as described above. Such a computer program product may be embodied in a carrier medium or may be transmitted over a local or wide area network.

The present invention also relates to a switching control circuit for driving a flow of direct current through an at least partially inductive load, the switching control circuit comprising at least a first semiconductor switch having a control terminal for receiving a control current ($I_G$), said control current controlling the resistance of a path between a load terminal, for connecting to said at least partially inductive load, and a supply terminal, for connecting to a supply voltage source, at least one semiconductor freewheeling component coupled between said load terminal and ground, and a controller for adjusting said control current ($I_G$) in order to activate and/or deactivate the flow of current to said load terminal, wherein said controller comprises a timer element for initiating at least one timed adjustment of the control current ($I_G$) during activation or deactivation of the flow of current through the first semiconductor switch so as to anticipate a state change of a component of the switching control circuit, the controller being adapted for determining a timing for the timed adjustment in a predictive manner based on a measurement in an earlier cycle for switching the first semiconductor switch. In some embodiments, a state change of a component may be a state change of the semiconductor freewheeling component between a current-conducting state and a current non-conducting state.

The controller may be adapted for determining a timing for the timed adjustment based on a measurement in an earlier cycle for switching the first semiconductor switch. The earlier cycle may be the previous cycle, one or more recent cycles, etc.

The controller may comprise an evaluation means for evaluating a state change of the semiconductor freewheeling component and determining a timing based thereon and wherein the timer element comprises a memory element for storing the timing for use in a future switching action. The future switching action may be the next cycle for switching the first semiconductor switch.

The evaluation means may comprise at least one comparator for comparing the voltage at the load terminal to a reference voltage.

The at least one comparator may be a comparator for determining a sign of the difference between the voltage at the load terminal and the reference voltage.

The evaluation means may be adapted for determining a difference between an edge signal in the at least one comparator and a state transition of a component of the switching control circuit.

The switching control circuit may furthermore comprise an adaptation unit for altering the timing for the timed adjustment if the determined difference is larger than a predetermined value.

The memory element furthermore may be adapted for storing a current magnitude in combination with said timing for use in future switching actions.

The switching control circuit furthermore may comprise a second semiconductor switch having a control terminal for receiving a second control current ($I'_G$), said second control current controlling the resistance of a path to the load terminal, e.g. between the load terminal and the ground, the controller being furthermore adapted for adjusting the timing of a timed adjustment of said second control current ($I'_G$) during activation or deactivation of the flow of current through the second semiconductor switch from the load terminal.

The control circuit may be programmed for performing a method as described above.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a current source resistive switch, reference may be made to any suitable resistive switch such as for example a transistor. A transistor may be a three-terminal device, comprising a first main electrode such as a drain, a second main electrode such as a source and a control electrode such as a gate for controlling the flow of electrical charges between the first main electrode and the second main electrode. Any type of transistor may be envisaged, such as for example mosfet switches as well as bipolar switches.

Where in embodiments of the present invention reference is made to a power switch freewheeling element, reference may be made to a freewheeling diode, although embodiments of the present invention are not limited thereto.

In a first aspect, the present invention provides in a switching control circuit for driving a flow of direct current through an at least partially inductive load. The inductive load may for example be connected to ground, or may for example be connected to a sine wave mode VBAT via a transistor. The switching control circuit according to embodiments of the present invention advantageously can be used in BLDC motors having three phases, but also in DC motors having one or two phases. According to embodiments of the present invention, the switching control circuit (1) comprises at least a first semiconductor switch (4) having a control terminal for receiving a control current ($I_G$), said control current controlling the resistance of a path between a load terminal (3), for connecting to said at least partially inductive load (10), and a supply terminal (2), for connecting to a supply voltage source. The switching control circuit also comprises at least one semiconductor freewheeling component (5) coupled between said load terminal (3) and ground (11). It further comprises a controller (6) for adjusting said control current ($I_G$) in order to activate and/or deactivate the flow of current to said load terminal (3). The controller according to embodiments of the present invention comprises a timer element (7) for initiating at least one timed adjustment of the control current ($I_G$) during activation or deactivation of the flow of current through the first semiconductor switch (4) so as to anticipate a state change of a component of the switching control circuit (1), the controller (6) being adapted for determining a timing for the timed adjustment in a predictive manner. By way of illustration, embodiments not being limited thereto, further features and advantages will be illustrated in particular embodiments below.

Figure 1:
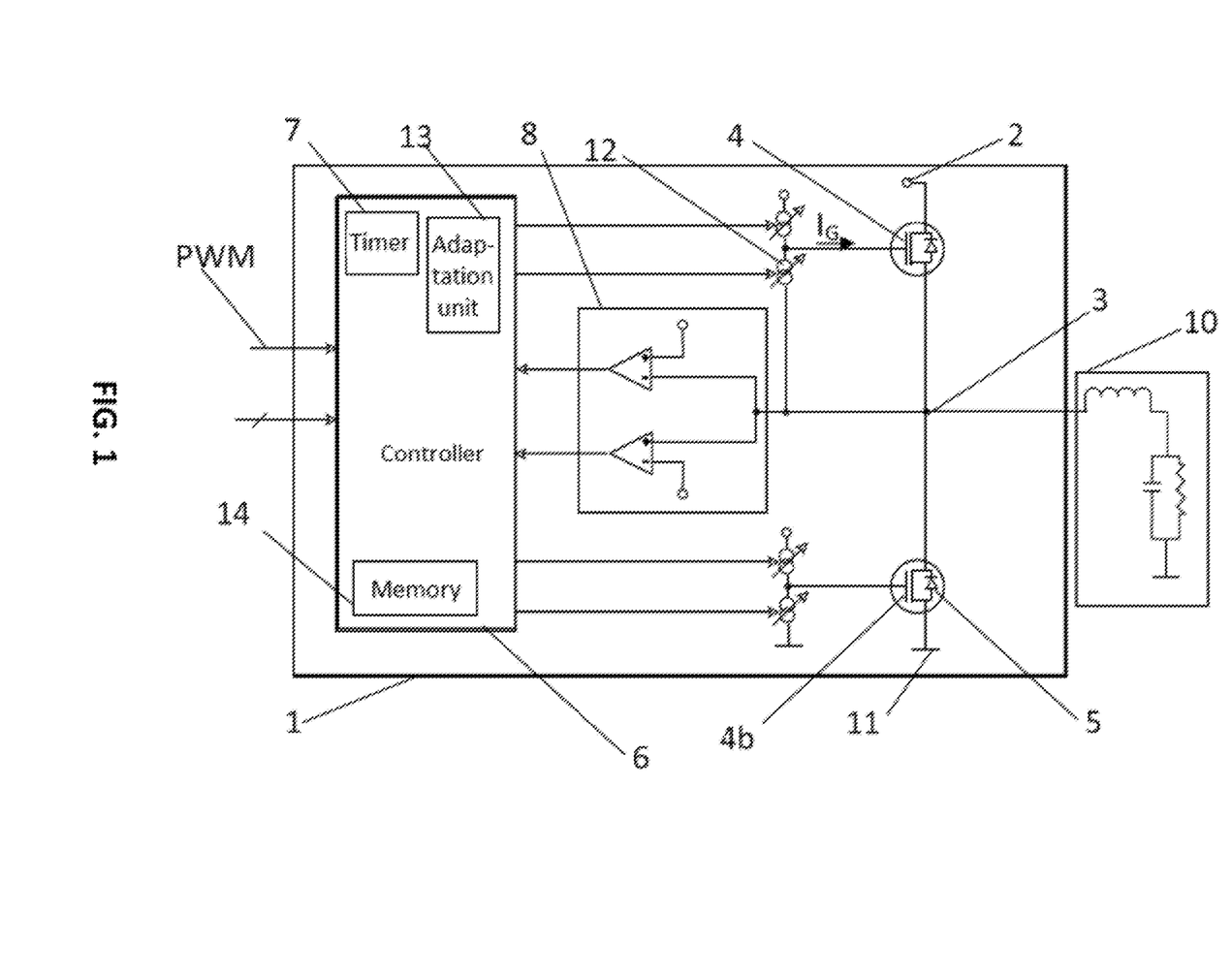
FIG. 1 shows an overview of a switching control circuit according to embodiments of the present invention.

An embodiment of such a switching control circuit 1 is illustrated in FIG. 1. This control circuit 1 comprises a semiconductor switch 4, for example a transistor, e.g. a MOSFET. This semiconductor switch 4 has a control terminal for receiving a control current $I_G$. For example the control terminal may be connected to the gate of a MOSFET, such that a control current $I_G$ may charge or discharge the gate. This control current $I_G$ controls the resistance of a path between a load terminal 3 and a supply terminal 2. The load terminal 3 is adapted for connecting to the at least partially inductive load 10, e.g. for connecting to a terminal of the inductive load 10 so as to couple the load 10 between the semiconductor switch 4 and ground 11. The load terminal may be connectable or connected to the at least partially inductive load 10. The supply terminal 2 is adapted for connecting to a supply voltage source, for example to a battery. The supply terminal 2 may be connected or connectable to a direct current voltage source, the voltage source providing a voltage difference relative to ground 11, such as a substantially constant voltage difference.

The control circuit 1 further comprises a semiconductor freewheeling component 5 coupled between the load terminal 3 and ground 11. For example, when the at least partially inductive load 10 is connected between the load terminal 3 and ground 11, the semiconductor freewheeling component 5 is coupled in parallel to this at least partially inductive load 10. The semiconductor freewheeling component 5 may be a diode, e.g. a flyback diode. This semiconductor freewheeling component 5 may be arranged such that current is allowed to pass in one direction, e.g. allowing a positive current from the ground 11 to the load terminal 3, while substantially blocking current in the other direction, e.g. blocking a positive current from the load terminal 3 to the ground 11. This semiconductor freewheeling component 5 may have a current-conducting state, e.g. in which current is allowed to pass, and a current non-conducting state, e.g. in which current is blocked. Switching between these states may typically involve the building up or depleting of mobile charge, and therefore may involve a switching time, e.g. a reverse recovery time.

The switching control circuit 1 further comprises a controller 6 for adjusting the magnitude and direction of the control current $I_G$ in order to activate or deactivate the flow of current to the load terminal 3. For example, the controller 6 may receive an external instruction to activate or deactivate the at least partially inductive load 10, e.g. such an instruction represented by a signal or signal change on a digital logic control signal input line PWM. Detecting a falling edge on the input PWM may constitute an instruction to deactivate the load 10.

Alternatively, the controller 6 may generate an internal instruction to activate or deactivate the at least partially inductive load 10, for example in response to programmed conditions.

The controller 6 comprises a timer element 7 for initiating at least one timed adjustment of the control current $I_G$ for example so as to anticipate a state change of the semiconductor freewheeling component 5 between a current-conducting state and a current non-conducting state.

Figure 2:
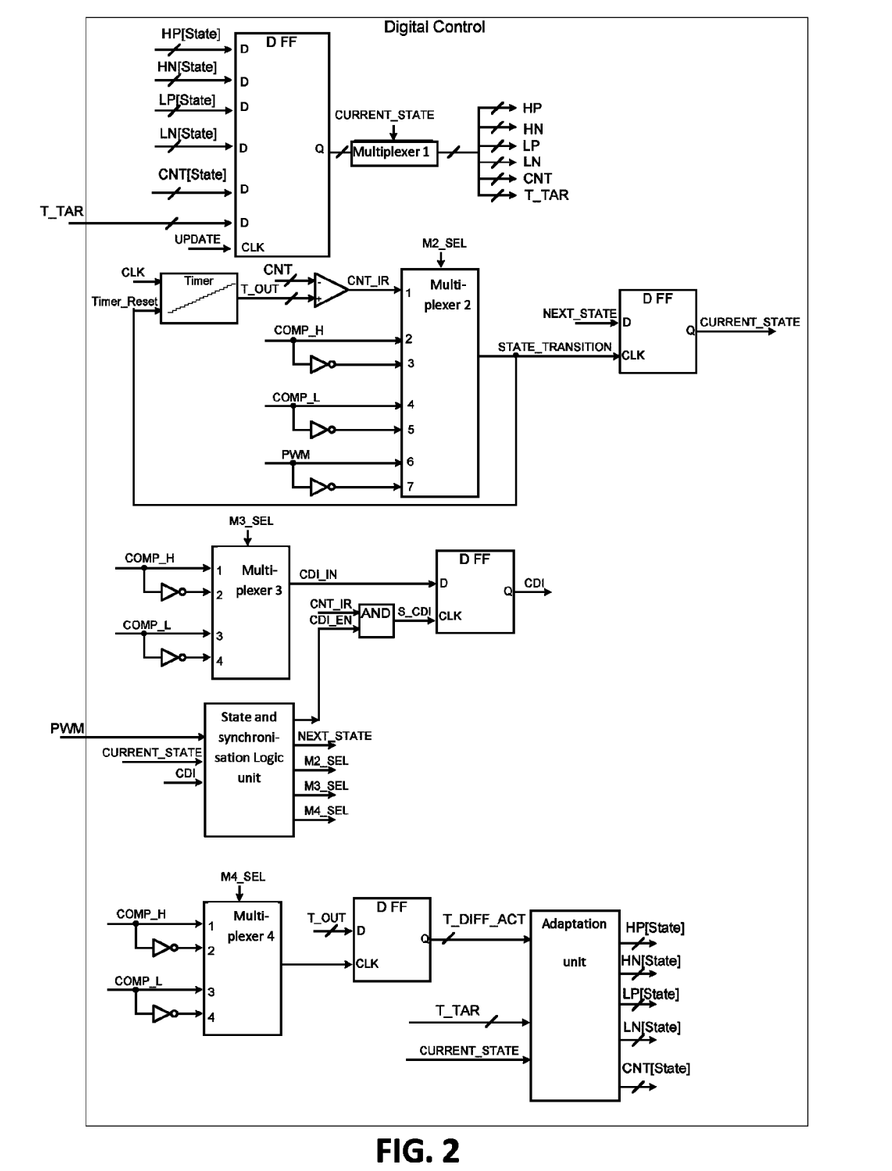
FIG. 2 shows components of an exemplary controller for use in a switching control circuit according to embodiments of the present invention.

By way of illustration, embodiments of the present invention not being limited thereto, a further example of a switching control circuit is described with reference to FIG. 1 and FIG. 2. The different components of the exemplary control circuit described can be found below. The control circuit comprises a High Side Transitor (HST) with anti-parallel diode (HSD) capable to conduct current between the battery supply and the load terminal and a Low Side Transitor (LST) with anti-parallel diode (LSD) capable to conduct current between ground and the load terminal. It furthermore comprises at least one input terminal to receive an input control command PWM, a digital storage means capable of storing parameters, e.g. a set of D FlipFlop (DFF) and a storage element storing the current state of the control circuit. The exemplary switching control unit also comprises a multiplexer, capable to select from the parameter storage means parameters associated with the current state of the control circuit and providing these parameters to a timer comparator and to charge/discharge switches (current sources or resistive switches) HSP, HSN, LSP, LSN. The control circuit described also comprises a timer counter providing a signal proportional to the elapsed time since the last reset to a timer comparator, the timer comparator comparing two inputs, namely the output of the timer counter and the parameter received from the multiplexer and outputting a logic one, if the counter input is larger than the parameter input and a logic zero else. The control circuit also comprises a comparator (HS_COMP) means, capable of comparing the voltage of the load terminal with a high reference voltage (VREF_H) and providing a logic one if the terminal voltage is smaller than VREF_H and a comparator (LS_COMP) means, capable of comparing the voltage of the load terminal with a high reference voltage (VREF_L) and providing a logic one if the terminal voltage is larger than VREF_L. It furthermore comprises a switch HSP capable to turn on HST, the strength of the turn-on current being dependent on the multiplexer output parameter HP, a switch HSN capable to turn off HST, the strength of the turn-off current being dependent on the multiplexer output parameter HN, a switch LSP capable to turn on LST, the strength of the turn-on current being dependent on the multiplexer output parameter LP and a switch LSN capable to turn off LST, the strength of the turn-off current being dependent on the multiplexer output parameter LN. The control circuit further comprises a storage element CDI capable of storing the assumed current direction thru the load, e.g. CDI=1 if assumed current flow thru load is positive and CDI=0 else. Furthemore a means to measure the time difference between edges on HS_COMP and (certain) state transitions and to measure the time difference between edges on LS_COMP and (certain) state transitions also is present. The exemplary control circuit further comprises an adaptation unit being capable to adjust parameters in the parameter storage means based on measured time differences of the current cycle and given target time differences, so that the adapted parameters take effect in a future cycle in a way that the then measured time differences track the given target time differences. Furthermore a control logic being capable of outputting the next state of the circuit and a logic circuit to output a state transition burst signal with inputs may be present.

In one aspect, the present invention also relates to a method for controlling a flow of direct current through an at least partially inductive load (10) by way of driving at least a first semiconductor switch and at least one semiconductor freewheeling component (5). The method comprises driving a control gate of the at least a first semiconductor switch with a control current ($I_G$) for controlling a resistance of a path between a load terminal (3) connected to said at least partially inductive load (10) and a supply terminal (2) connected to a supply voltage source, and adjusting the control current ($I_G$) in order to alter the flow of current to said load terminal (3) after a predetermined time, the predetermined time being determined in a predictive manner so as to anticipate a state change of the first semiconductor switch or the at least one semiconductor freewheeling component (5). The method may comprise determining a predetermined time for adjusting the control current based on a measurement in an earlier cycle for switching the first semiconductor switch. The latter may include evaluating a state change of the first semiconductor switch or the semiconductor freewheeling component (5) storing the predetermined time for use in a future switching action. It also may comprise comparing a voltage at the load terminal (3) to a reference voltage. Such comparing may include determining a sign of a difference between the voltage at the load terminal (3) and the reference voltage. Based on this comparison, a predetermined time may be determining as the difference in the previous cycle between an edge signal in a compared voltage at the load terminal and the reference voltage on the one hand and a state transition of the first semiconductor switch and/or the semiconductor freewheeling component. As the storing of the adjusted predetermined timings may take some time, newly predetermined times may only be taken into account when they fall out a range of predetermined values.

By way of illustration, embodiments of the present invention not being limited thereto, an exemplary load deactivation operation cycle of an exemplary switching control circuit 1 according to an embodiment of the present invention will further be described with reference to FIG. 3A to FIG. 4B. Whereas FIG. 3a and FIG. 4a indicate exemplary operational cycles while FIG. 4A and FIG. 4B indicate corresponding parameter values or states. Four different situations are discussed. In all the examples described below, according to embodiments of the present invention, at least one of the periods of time is determined in a predictive manner.

Example 1

Figure 3A:
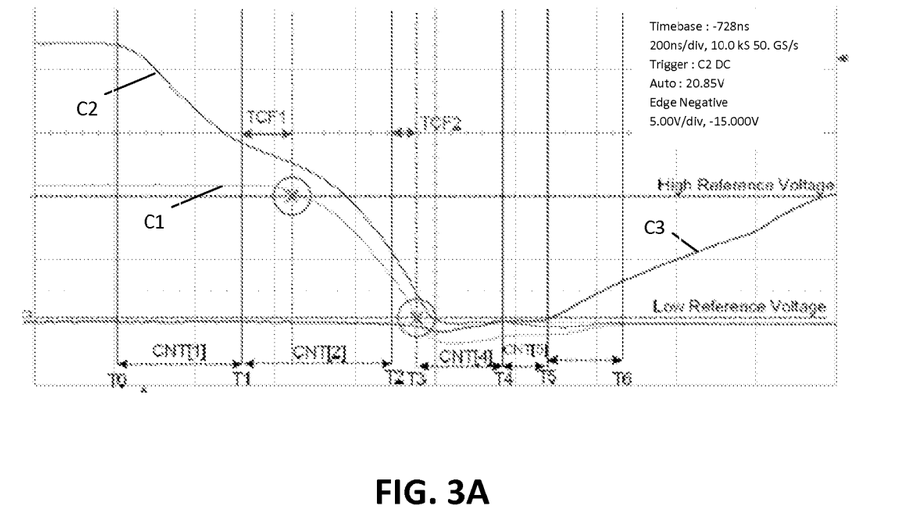
FIG. 3A and FIG. 3B illustrates an exemplary load deactivation operational cycle of a switching control circuit if the current through the load is positive and corresponding parameters, according to embodiments of the present invention.
Figure 3B:
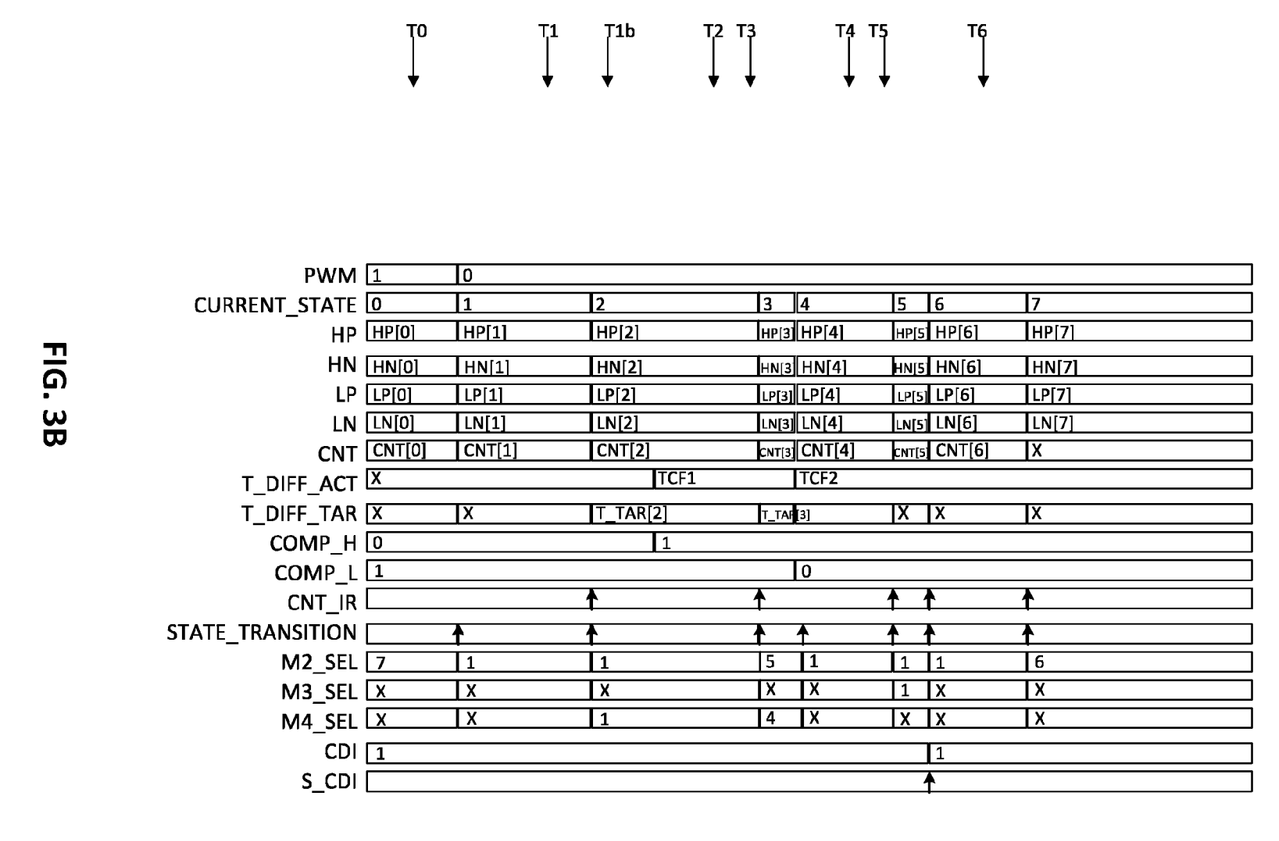

After a falling PWM input at T0 and if the assumed current direction through the load is positive (CDI=1)

First the control gate of the HS FET is discharged with a discharge current strength HN[1] for a period of time CNT[1] and then it is reduced the discharge current to a lower value HN[2]. CNT[1] and HN[1] can either be predetermined or adapted parameters from a previous cycle in a way, that T1 occurs a desired target period of time T_TAR[2] before the terminal load voltage falls below a first reference voltage VERF_H. T_TAR[2] may be chosen to compensate any delay caused by the comparator and logic, in a way that the load voltage has not significantly changed before T1.

Taking a measure (TCF1) of the time difference between T1 and the instance in time when the terminal load voltage falls below a first reference voltage VERF_H during the current cycle and adapting parameter table entries CNT[1] and/or HN[1], so that T1 occurs a certain time prior to the terminal load voltage falls below a first reference voltage VERF_H in the next cycle.

The adaptation unit may only adapt the table entry, if TCF1 is outside a predetermined window of allowed values.

After time T1, discharging the HST with current HN[2] for a period of time CNT[2] and reducing the current thereafter.

The period of time CNT[2] may be predetermined or it may be adapted based on a previous cycle measurement in a way that T2 occurs a desired period of time T_TAR [3] before the time instance when the load voltage falls below a second reference voltage VREF_L. T_TAR [3] may be chosen, to compensate any delay caused by the comparator and logic so that the discharge current is reduced before the current commutation from the HST to the LSD begins.

Taking a measure (TCF2) of the time difference between T2 and the instance in time when the load voltage falls below a second reference voltage VERF_L during the current cycle and adapting parameter table entries CNT[2] and/or HN[2] and/or CNT[1] and/or HN[1], so that T2 occurs a certain time (T_TAR [3]) prior to the load voltage falls below a second reference voltage VERF_L in the next cycle.

In particular: HN[2]=Constant8*(TCF2−T_TAR[3]), with Constant8>0 in order to regulate the dv/dt.

The adaptation unit may adapt the table entries only, if (TCF2−T_TAR[3]) is outside a defined window of allowed values.

At time T2, discharging the gate of HST with the reduced discharge current HN[3].

After the load voltage falls below a second reference voltage VREF_L the discharge current HN[4] is applied for a predetermined period of time CNT[4] and increased afterwards. HN[4] being the same as HN[3]. CNT[4] may be chosen to allow the LSD to fully turn on before T4. CNT[4] may be a predetermined value.

At time T4 the discharge current strength is increased to HN[5] in order to rapidly remove the remaining gate charge from the HS FET. After a predetermined period of time at T5, the HS FET has completely stopped conduction and switching on the LS FET may be enabled.

At time T5 charging the gate of the LST with charging current strength LP[6] for a period of time CNT[6] and increasing the charging current strength after CNT[6] to a higher value LP[7], so that T6 occurs shortly after the current commutation from the LSD to the LST has finished. LP[6] may be a predetermined value and chosen, so that the resulting di/dt of the LST is slow enough for the LSD to turn off at the same pace.

CNT[6] and LP[6] being either predetermined or adapted parameters. CNT[6] may be adapted:

$$CNT[6]=Constant2*(Constant3*(TR4-TR3)*HP[11]/LP[6]+Constant4*TCF3*HP[12]/LP[6])$$

based on TCF3 measurement from a previous cycle.

Evaluating at an instance in time after T0 and before T5 the first or second reference comparators in order to determine the current direction in the inductive load and store the result to be used at the next cycle.

Example 2

Figure 4A:
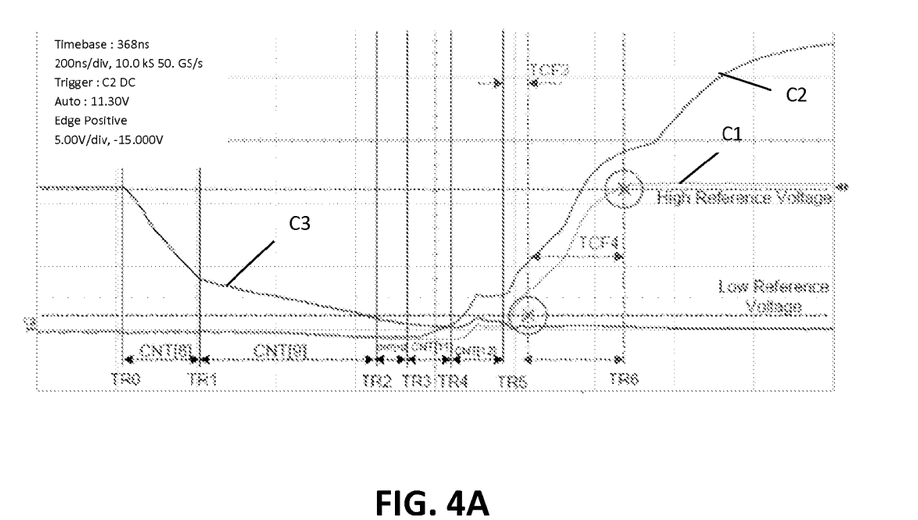
FIG. 4A and FIG. 4B illustrates an exemplary load activation operational cycle of a switching control circuit if the current through the load is positive and corresponding parameters, according to embodiments of the present invention.
Figure 4B:
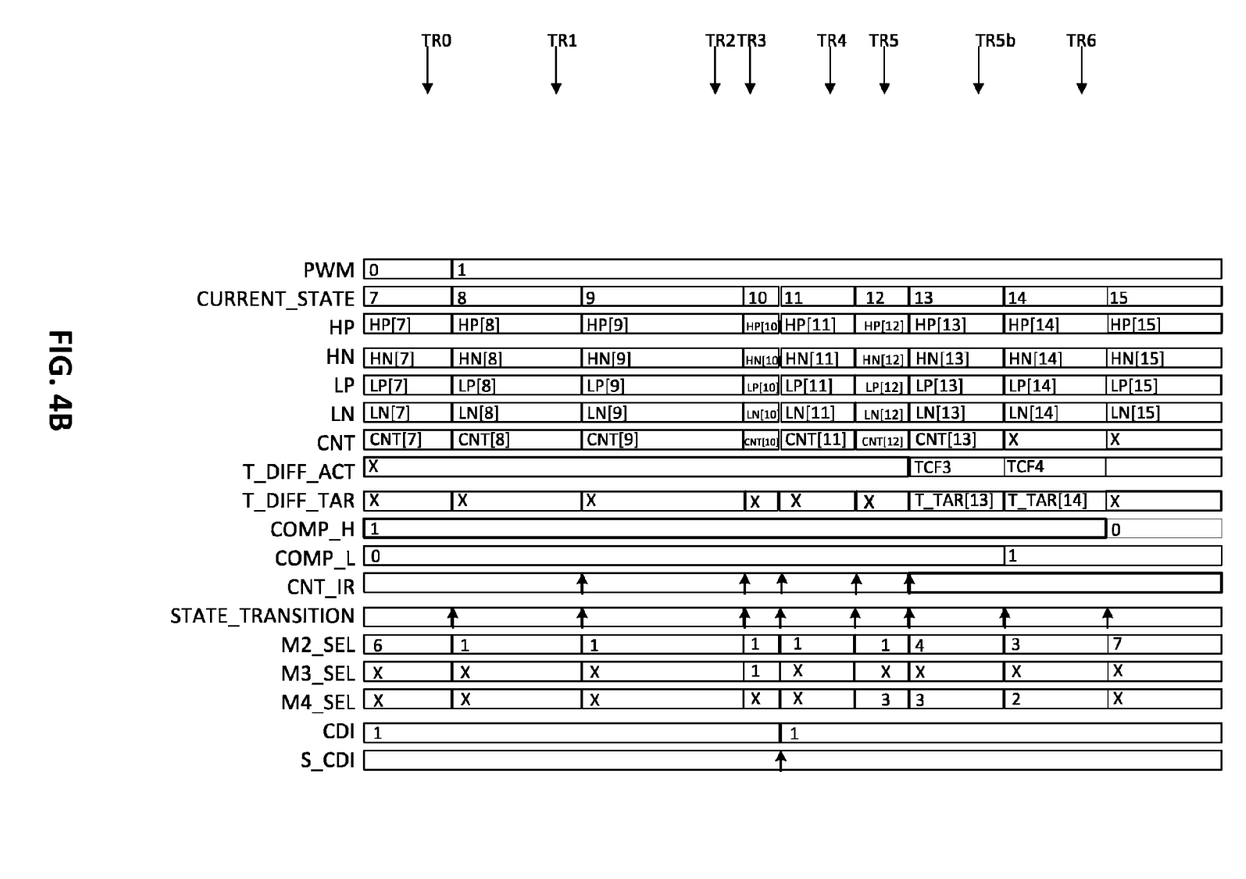

After receiving a rising edge on the PWM input at time TR0 and if the assumed current direction thru the load is positive (CDI=1).

Discharging the gate of the LS FET with a discharge current strength LN[8] for a period of time CNT[8] and reducing the discharge current strength after the period of time at TR1. CNT[8] a predetermined or adapted parameter so that the discharge current is reduced before the current commutation from the LST to the LSD begins (change of diode voltage).

The duration CNT[8] and current strength LN[8] may be either predetermined or being adapted.

CNT[8] maybe calculated as $$CNT[8]=Constant5*(CNT[1]*HN[1]/LN[8])$$

At TR1 discharging the gate of the LS FET with a discharge current strength LN[9] for a period of time CNT

[9] and increasing the discharge current strength after the period of time at TR2. CNT[9] and LN[9] being either predetermined or being adapted parameter chosen in order that the current commutation from LST to LSD is completed before TR2.

CNT[9] may be a function of CNT[8]:

$$CNT[9]=\text{Constant0}-\text{Constant1}*CNT[8]$$

CNT[10] and LN[10] being predetermined parameters chosen large enough to remove the remaining gate charge from the LST.

At TR3 charging the gate of the HS FET with a charge current strength HP[11] for a period of time CNT[11] and reducing the charge current strength after the period CNT [11] elapsed.

CNT[11] and HP[11] being either predetermined or adapted parameters from a previous cycle in a way, that at TR4 the HST has not started to conduct and the LSD is still conducting the entire load current.

At TR4 charging the HS FET with HP[12] for a period of time CNT[12] and increasing the charge current strength after the period CNT[12] elapsed at TR5. HP[12] may be a predetermined or adapted parameter being chosen so that the di/dt of the HST is slow enough for the LSD to avoid excessive reverse recovery currents.

Taking a measure TCF3 of the time difference between TR5 and the instance in time when the load terminal voltage exceeds VREF_L.

Based on the measured (positive or negative) TCF3 the adaptation unit may carry out parameter adjustments only if (TCF3−T_Tar[13]) is outside an allowed window. The size of the window may depend on the specified minimum and maximum comparator and other circuit delay in the chain.

In order to ensure that the entire current commutation is done with the small HP[12] strength, the adaptation unit may adapt CNT[12] within an allowed window of values. The minimum value being sufficiently long, so that the resulting gate charge delta (~CNT[12]*HP[12]) can cause the complete current commutation. The maximum value being dependent upon the ratio between HP[12] and HP[11].

The adaptation unit may adapt CNT[11] and/or CNT[12].

Charging the gate of the HST with current strength HP[13] and HP[14] until the load voltage exceeds VREF_H and increasing the charge current strength afterwards.

Taking a measure for the elapsed time between the load voltage passing VREF_L and VREF_H (TCF4).

Adapting parameter HP[13] and HP[14] based on TCF4 measurement and target value T_TAR[13]:

HP[13]=HP[14]=Constant7*(TCF4−T_TAR[14]), with Constant7>0.

In order to regulate the du/dt.

The adaptation unit may only adapt HP[13] and HP[14] if (TCF4−T_TAR[14]) is outside a defined window of allowed values.

Evaluating at an instance in time after TR0 and before TR3 the first or second reference comparators in order to determine the current direction in the inductive load and store the result to be used at the next cycle.

Using S_CDI signal as the UPDATE signal.

Example 3

Figure 6:
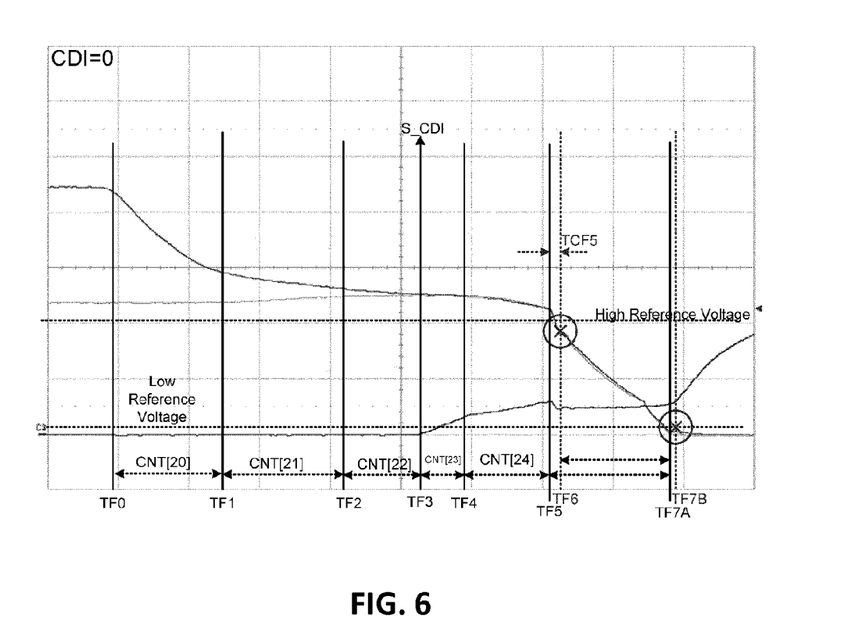
FIG. 6 shows an example waveform after a falling PWM input signal if the current through the load is negative, illustrating features of embodiments of the present invention.

After a falling PWM input at TF0 and if the assumed current direction thru the load is negative (CDI=0):

Discharging the gate of the HS FET with a discharge current strength HN[20] for a period of time CNT[20] and then to reduce the discharge current to a lower value HN[21].

CNT[20] a predetermined or adapted parameter so that the discharge current is reduced before the current commutation from the HST to the HSD begins (change of diode voltage).

CNT[20] maybe calculated as $$CNT[20]=\text{Constant20}*(CNT[30]*LN[30]/HN[20])$$

At TF1 discharging the gate of the HS FET with a discharge current strength HN[21] for a period of time CNT[21] and increasing the discharge current strength after the period of time at TF2. CNT[21] and HN[21] being either predetermined or being adapted parameter chosen in order that the current commutation from LST to LSD is completed before TF2.

CNT[21] may be a function of CNT[30]:

$$CNT[21]=\text{Constant21}A-\text{Constant21}B*CNT[30]$$

CNT[22] and HN[22] being predetermined parameters chosen large enough to remove the remaining gate charge from the HST.

At TF3 charging the gate of the LST with a charge current strength LP[23] for a period of time CNT [23] and decreasing the charge current strength afterwards.

Charging LST with LP[24] for a period of time CNT[24] and increasing the charge current strength afterwards.

Taking a measure TCF5 of the time difference between TF5 and TF6 (the instance in time when the load terminal voltage exceeds VREF_L).

The adaptation unit may adapt CNT[23] and/or CNT[24] in order that TCF5 tracks T_TAR[24].

Based on the measured (positive or negative) TCF5 the adaptation unit may carry out parameter adjustments only if (TCF5−T_Tar[24]) is outside an allowed window. The size of the window may depend on the specified minimum and maximum comparator and other circuit delay in the chain.

In order to ensure that the entire current commutation is done with the small LP[24] strength, the adaptation unit may adapt CNT[24] within an allowed window of values. The minimum value being sufficiently long, so that the resulting gate charge delta (~CNT[24]*LP[24]) can cause the complete current commutation. The maximum value being dependent upon the ratio between LP[24] and LP[23].

The algorithm may attempt to find the maximum of CNT[23] at the minimum of CNT[24] (within window) so that (TCF5−T_Tar[24]) is inside an allowed window.

Increasing the LST charge current a period of time after TF5 or TF6 (at TF7A) or after the terminal voltage fell below lower reference voltage at TF7B.

Evaluating at an instance in time after TF0 and before TF3 the first or second reference comparators in order to determine the current direction in the inductive load and store the result to be used at the next cycle.

Example 4

Figure 7:
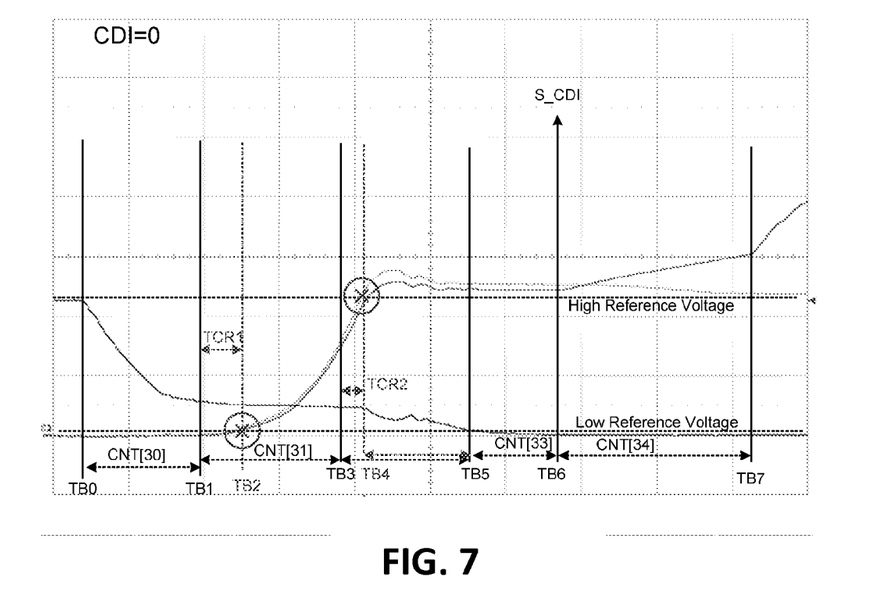
FIG. 7 shows an example waveform after a rising PWM input signal if the current through the load is negative, illustrating features of embodiments of the present invention.

After a rising PWM input at TB0 and if the assumed current direction thru the load is negative (CDI=0):

Discharging the gate of the LS FET with a discharge current strength LN[30] for a period of time CNT[30] and then reduce the discharge current to a lower value LN[31].

CNT[30] and LN[30] being predetermined or adapted parameters from a previous cycle in a way, that the discharge current is reduced a desired target period of time T_TAR[30]

before the terminal voltage exceeds the lower reference voltage VREFL. T_TAR[30] may be chosen to compensate any delay caused by the comparator and logic, in a way that the load voltage has not significantly changed before TB1.

Taking a measure (TCR1) of the time difference between TB1 and TB2 (the instance in time when the terminal load voltage exceeds a first reference voltage VERF_L) during the current cycle and adapting parameter table entries CNT [30] and/or LN[30], so that TB1 occurs a certain time prior to TB2 in the next cycle.

The adaptation unit may only adapt the table entry, if TCR1 is outside a predetermined window of allowed values.

After time TB1, discharging the LST with current LN[31] for a period of time CNT[31] and reducing the current thereafter.

The period of time CNT[31] may be predetermined or it may be adapted based on a previous cycle measurement in a way that TB3 occurs a desired period of time T_TAR [31] before the time instance when the load voltage exceeds a reference voltage VREF_H. T_TAR [31] may be chosen, to compensate any delay caused by the comparator and logic so that the discharge current is reduced before the current commutation from the LST to the HSD begins.

Taking a measure (TCR2) of the time difference between TB3 and TB4 (the instance in time when the load voltage exceeds a higher reference voltage VERF_H) during the current cycle and adapting parameter table entries CNT[31] and/or LN[31] and/or CNT[30] and/or LN[30], so that TB3 occurs a certain time (T_TAR [31]) prior to TB4 in the next cycle.

Discharging the LST gate for a period of time unitl TB5 either measured after TB3 or TB4 and increasing the gate discharge current afterwards.

Discharging the gate of LST with a high current from TB5 till TB6.

Charging HST with HP[34] for a period of time CNT[34] and increasing the charge current strength afterwards.

Parameter CNT[34] maybe predetermined or adapted based on parameters CNT[23], CNT[24] and LP[23], LN[24]

$$CNT[34]=CONST34*(CNT[23]*LP[23]+CNT[24]*LP[24])/HP[34]$$

Evaluating at an instance in time after TB0 and before TB6 the first or second reference comparators in order to determine the current direction in the inductive load and store the result to be used at the next cycle.

Figure 5:
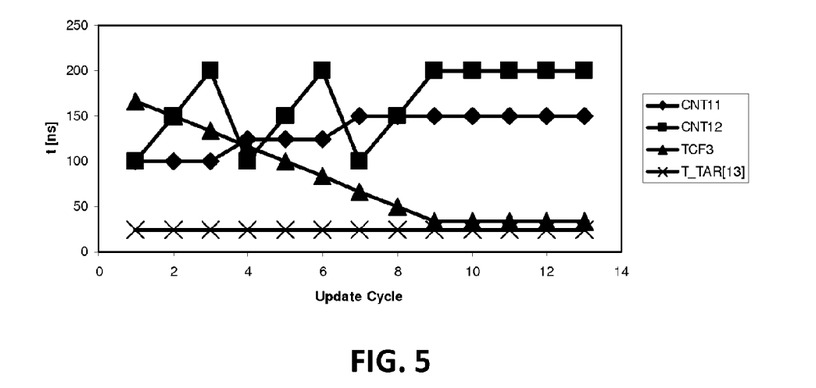
FIG. 5 shows an example of parameter update cycles of the parameter TCF3, illustrating features of embodiments of the present invention.

By way of illustration, embodiments of the present invention not being limited thereto, several parameter update cycles of the parameter TCF3 are shown in FIG. 5. In this example, 6*HP[12]=2*HP[13]=HP[11] and CNT[12] is in {100 ns . . . 200 ns} with a minimum specified comparator delay of 35 ns, i.e. TCF3 is in {0 ns . . . 35 ns}. It can be seen that the parameter converges after 9 update cycles, when the increase of the charging current occurs 30 ns before the comparator, hence the switching losses may be reduced in comparison to a non-optimized, e.g. a non-adaptive, method of switching control.

The invention claimed is:

1. A method for controlling a flow of direct current through an at least partially inductive load by way of driving a first semiconductor switch and a semiconductor freewheeling component, the method comprising:
   driving a control gate of the first semiconductor switch with a control current for controlling a resistance of a path between a load terminal connected to said at least partially inductive load and a supply terminal connected to a supply voltage source; and
   determining a predetermined time for adjusting the control current in a predictive manner, based on a measurement in one cycle for switching the first semiconductor switch, so as to anticipate a state change of the first semiconductor switch or the semiconductor freewheeling component;
   wherein, in a later cycle for switching the first semiconductor switch, adjusting the control current in order to alter the flow of current to said load terminal after said predetermined time, and
   wherein adjusting the control current comprises selecting parameters associated with the control current and providing these parameters to a timer comparator and to two or more charge or discharge switches for controlling the strength of the turn-on current and the strength of the turn-off current of the first semiconductor switch.

2. A method for controlling a flow according to claim 1, wherein determining the predetermined time comprises determining a current direction indication and wherein adjusting the control current is based on said current direction indication.

3. A method according to claim 2, wherein the current direction indication is determined in a cycle and the determined current direction indication is used in a later cycle in order to adjust the control current or wherein determining the predetermined time comprises evaluating a state change of the first semiconductor switch or the semiconductor freewheeling component and storing the predetermined time for use in said later switching action or wherein determining the predetermined time comprises comparing a voltage at the load terminal to a reference voltage.

4. A method for controlling a flow according to claim 3, wherein said comparing comprises determining a sign of a difference between the voltage at the load terminal and the reference voltage.

5. A method for controlling a flow according to claim 4, wherein determining the predetermined time comprises determining a difference between an edge signal in a compared voltage at the load terminal and the reference voltage on the one hand and a state transition of the first semiconductor switch or the semiconductor freewheeling component or, adjusting the predetermined time if the determined difference is not within a predetermined range of values.

6. A method for controlling a flow according to claim 1, wherein the predetermined time is determined, taking into account delays occurring in the prediction process.

7. A method for controlling the flow according to claim 1, wherein controlling the flow of direct current through the at least partially inductive load is performed by way of driving the first semiconductor switch, a second semiconductor switch, the semiconductor freewheeling component, and a second semiconductor freewheeling component, wherein after receiving a falling PWM input and for a positive current direction through the load, the method comprises:
   discharging the gate of the first semiconductor switch with a first discharge current strength and reducing the first discharge current strength to a second discharge current strength after a first predetermined time;
   discharging the gate of the first semiconductor switch with the second discharge current strength and reducing after a second predetermined time the second discharge current strength to a third discharge current smaller than a second discharge current strength;

discharging the gate of the first semiconductor switch with a fourth discharge current strength and increasing after a third predetermined time the discharge current strength to a fifth discharge current for rapidly removing the remaining control gate charge; and charging a control gate of the second semiconductor switch with a first charge current strength and increasing a charge current strength to a second charge current strength after a fourth predetermined time;

wherein one or more of the first predetermined time, the second predetermined time, the third predetermined time or the fourth predetermined time are determined in a predictive manner.

8. A method according to claim 7, wherein the first predetermined time is predicted so that the reducing is performed before a terminal load voltage falls below a first reference voltage and wherein optionally a new first predetermined time is predicted for use in a next cycle taking into account a measure of the time difference between the moment reducing is performed in the current cycle and a moment when the terminal load voltage falls below the first reference voltage in the current cycle.

9. A method according to claim 7, wherein the second predetermined time is predicted so that the reducing is performed before a terminal load voltage falls below a second reference voltage and wherein optionally a new second predetermined time is predicted for use in a next cycle taking into account a measure of the time difference between the moment reducing is performed in the current cycle and a moment when the terminal load voltage falls below the second reference voltage in the current cycle.

10. A method according to claim 7, wherein the third predetermined time is predicted so that the increasing the discharge current is performed after the semiconductor freewheeling component is fully turned on or wherein the fourth predetermined time is predicted so that increasing a charge current strength to a second charge current strength is performed after the current commutation from the second semiconductor freewheeling component to the second semiconductor switch has finished.

11. A method for controlling a flow according to claim 1, wherein controlling the flow of direct current through the at least partially inductive load is performed by way of driving the semiconductor switch, a second semiconductor switch, the first semiconductor freewheeling component and a second semiconductor freewheeling component, wherein after receiving a rising PWM input and for a positive current direction through the load, the method comprises:

discharging the gate of the second semiconductor switch with a sixth discharge current strength and reducing the sixth discharge current strength to a seventh discharge current strength after a fifth predetermined time;

discharging the gate of the second semiconductor switch with the seventh discharge current strength and increasing, after the sixth predetermined time, the discharge current strength to an eighth discharge current larger than the seventh discharge current strength;

charging a control gate of the first semiconductor switch with a third charge current strength and reducing the charge current strength to a fourth charge current strength after a seventh predetermined time;

charging the control gate of the first semiconductor switch with a fourth charge current strength and increasing the charge current strength to a fifth charge current strength after an eighth predetermined time; and charging the control gate of the first semiconductor switch with a sixth charge current strength after a ninth predetermined time, one or more of the fifth predetermined time, the sixth predetermined time, the seventh predetermined time, the eighth predetermined time or the ninth predetermined time are determined in a predictive manner.

12. A method according to claim 11, wherein the fifth predetermined time is predicted so that the reducing is performed before the current is commuted from the first semiconductor switch to the first semiconductor freewheeling element or wherein the sixth predetermined time is predicted so that increasing the discharge to the eighth discharge current strength is performed before the current commutation from the second semiconductor transistor to the second semiconductor freewheeling component is completed.

13. A method according to claim 2, wherein said current direction indicator is used for selecting, in said later cycle for switching, a predetermined driving waveform shape.

14. A switching control circuit for driving a flow of direct current through an at least partially inductive load, the switching control circuit comprising:

a first semiconductor switch having a control terminal for receiving a control current, said control current controlling the resistance of a path between a load terminal, for connecting to said at least partially inductive load, and a supply terminal, for connecting to a supply voltage source;

a semiconductor freewheeling component coupled between said load terminal and ground;

a controller for adjusting said control current in order to activate or deactivate the flow of current to said load terminal;

wherein said controller comprises a timer element for initiating a timed adjustment of the control current during a cycle for activation or deactivation of the flow of current through the first semiconductor switch so as to anticipate a state change of a component of the switching control circuit, the controller being configured to determine a timing for the timed adjustment in a predictive manner based on a measurement in an earlier cycle for switching the first semiconductor switch, and wherein the controller further comprises a multiplexer configured to select parameters from a parameter storage element, the parameters being associated with the current state of the control circuit and providing these parameters to the timer element and to two or more charge or discharge switches configured to turn on and off each of the at least one semiconductor switch, the strength of the turn-on and turn-off currents being dependent on the multiplexer output parameters.

15. A switching control circuit according to claim 14, wherein the controller being configured to determine a timing for the timed adjustment in a predictive manner comprises the controller being configured to determine a current direction indication and wherein said timed adjustment of the control current is based on said current direction indication or wherein the controller comprises an evaluator configured to evaluate a state change of the semiconductor freewheeling component and determining a timing based thereon and wherein the timer element comprises a memory element for storing the timing for use in a future switching action.

16. A switching control circuit according to claim 15, wherein the evaluator comprises a comparator for comparing the voltage at the load terminal to a reference voltage.

17. A switching control circuit according to claim 16, wherein the comparator is a comparator for determining a sign of the difference between the voltage at the load terminal and the reference voltage or wherein the evaluator is configured to determine a difference between an edge signal in the comparator and a state transition of a component of the switching control circuit.

18. A switching control circuit according to claim 17, furthermore comprising an adaptation unit for altering the timing for the timed adjustment if the determined difference is larger than a predetermined value.

19. A switching control circuit according to claim 14, wherein the parameter storage element furthermore is configured to store a current magnitude in combination with said timing for use in future switching actions or wherein the switching control circuit furthermore comprises a second semiconductor switch having a control terminal for receiving a second control current, said second control current controlling the resistance of a path between the load terminal and ground, the controller being furthermore configured to adjust the timing of a timed adjustment of said second control current during activation or deactivation of the flow of current through the second semiconductor switch from the load terminal.

20. A switching control circuit according to claim 14, the control circuit being programmed to control a flow.

\* \* \* \* \*